(12) United States Patent
Willis et al.

(10) Patent No.: US 6,894,895 B2
(45) Date of Patent: May 17, 2005

(54) EXPANSION CARD CAGE STABILIZER

(75) Inventors: Clifford B. Willis, Tracy, CA (US); Denise R. Silverman, San Carlos, CA (US); Nicholas J. Anderson, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 593 days.

(21) Appl. No.: 10/040,193

(22) Filed: Dec. 19, 2001

(65) Prior Publication Data

US 2002/0095539 A1 Jul. 18, 2002

Related U.S. Application Data

(60) Provisional application No. 60/261,761, filed on Jan. 16, 2001.

(51) Int. Cl.[7] .................................................. G06F 1/16
(52) U.S. Cl. ..................... 361/686; 361/800; 361/725
(58) Field of Search ................................ 361/686, 752, 361/797, 800, 683, 725, 802, 759

(56) References Cited

U.S. PATENT DOCUMENTS 6,498,731 B1 * 12/2002 Roscoe et al. .............. 361/796
6,570,770 B1 *  5/2003 Ross et al. .................. 361/752

* cited by examiner

Primary Examiner—Randy W. Gibson
Assistant Examiner—Hung S. Bui
(74) Attorney, Agent, or Firm—Park, Vaughan & Fleming LLP

(57) ABSTRACT

An expansion enclosure allows additional expansion cards to be used with a computer system. The enclosure exhibits a small footprint (e.g., one rack unit, or 1¾ inches) for installation in a rack or other area in which space is limited. The enclosure accepts one or more (e.g., four) expansion cards, which are connected to a removable expansion card cage. The removable cage forms part of the structure of the enclosure and provides strength and rigidity. A stabilizer may be removably but securely installed in the enclosure to stabilize or hold the removable cage as a card is installed in or removed from the cage.

20 Claims, 5 Drawing Sheets

EXPANSION CARD CAGE STABILIZER

This application claims the benefit of provisional application No. 60/261,761, filed Jan. 16, 2001.

BACKGROUND

This invention relates to the field of computer systems. More particularly, a stabilizing element is provided within a computer equipment enclosure for facilitating the installation or removal of a computer expansion card within a removable expansion card cage.

Computer systems are often configured with a limited number of slots or connectors for installing expansion cards designed to expand the computer system's functionality, such as memory boards, cards for interfacing peripheral devices, etc. Once the original slots are populated, additional functionality cannot be added without removing an existing card. This limits the flexibility and use of the system.

In some systems, a full-size "riser" card having multiple slots or connectors for expansion cards may be installed in one original slot of a computer system motherboard, thereby allowing multiple cards to be connected through one original slot. However, to accommodate such a riser card, the computer system must be relatively large in size, both vertically to accommodate the riser card and horizontally to accept any cards connected to the riser card. Computer system heights are often measured in rack units, particularly when mounted in a rack or other enclosure, wherein one rack unit is equal to approximately 1¾ inches. A computer system that can accommodate a full-size riser card may thus need to be on the order of three, four or more rack units tall, thereby consuming precious room in a computer rack or other equipment enclosure in which space is limited.

In many computer system environments, space is at a premium. Systems in such environments may be unable to accommodate full-size riser cards yet may still require added functionality. Or, even if a system can accommodate a riser card, there may be a need for more expansion cards than can be connected to it. For example, in the communications industry a great number of communication connections may be needed within the limited space of a computer system chassis, and a significant number of expansion cards may be needed to provide those connections. Existing solutions to these problems tend to require considerable amounts of space and labor.

In addition, it can be difficult to install an expansion board in typical computer system enclosures. It may be particularly difficult to connect an expansion card to a riser card, especially if the riser card is already installed or hosts one or more other expansion cards.

SUMMARY

In one embodiment of the invention, an enclosure for computer expansion cards is provided. The expansion card enclosure may be coupled to a computer system, or included within a computer system, to expand the number of cards that can be used with the computer. The expansion card enclosure thus allows functionality to be added to a computer system by adding expansion cards not to a motherboard, but rather to a discrete interface sub-assembly.

In this embodiment, the enclosure is low in height (e.g., one rack unit), thereby making it suitable for use in a computer equipment rack or other locations where efficient use of space is a significant concern. The enclosure provides connections (e.g., slots) for multiple cards, and is connected to a computer system through a suitable interface, such as PCI (Peripheral Component Interconnect), SCSI (Small Computer System Interface), etc.

An enclosure for expansion cards in a present embodiment of the invention includes a removable expansion card cage in which expansion cards may be installed horizontally, thereby allowing the enclosure to be only one rack unit high. The expansion cage may be easily removed to allow installation of the cards and then returned to its operational position. In one implementation, one or more fans are attached to the removable cage. Electrical and data connections between the removable cage and the enclosure are made via releasable connectors, and the cage may be removed and replaced with little effort.

In one embodiment of the invention, a stabilizer may be incorporated into the enclosure to facilitate installation and/or removal of expansion cards. In this embodiment, the stabilizer engages and steadies the expansion card cage while a card is installed (or removed), thereby providing a stable platform and facilitating card manipulation. The expansion cage may be configured with "safe" areas for handling the cage without damaging expansion cards, fans or other components.

DETAILED DESCRIPTION

Figure 1:
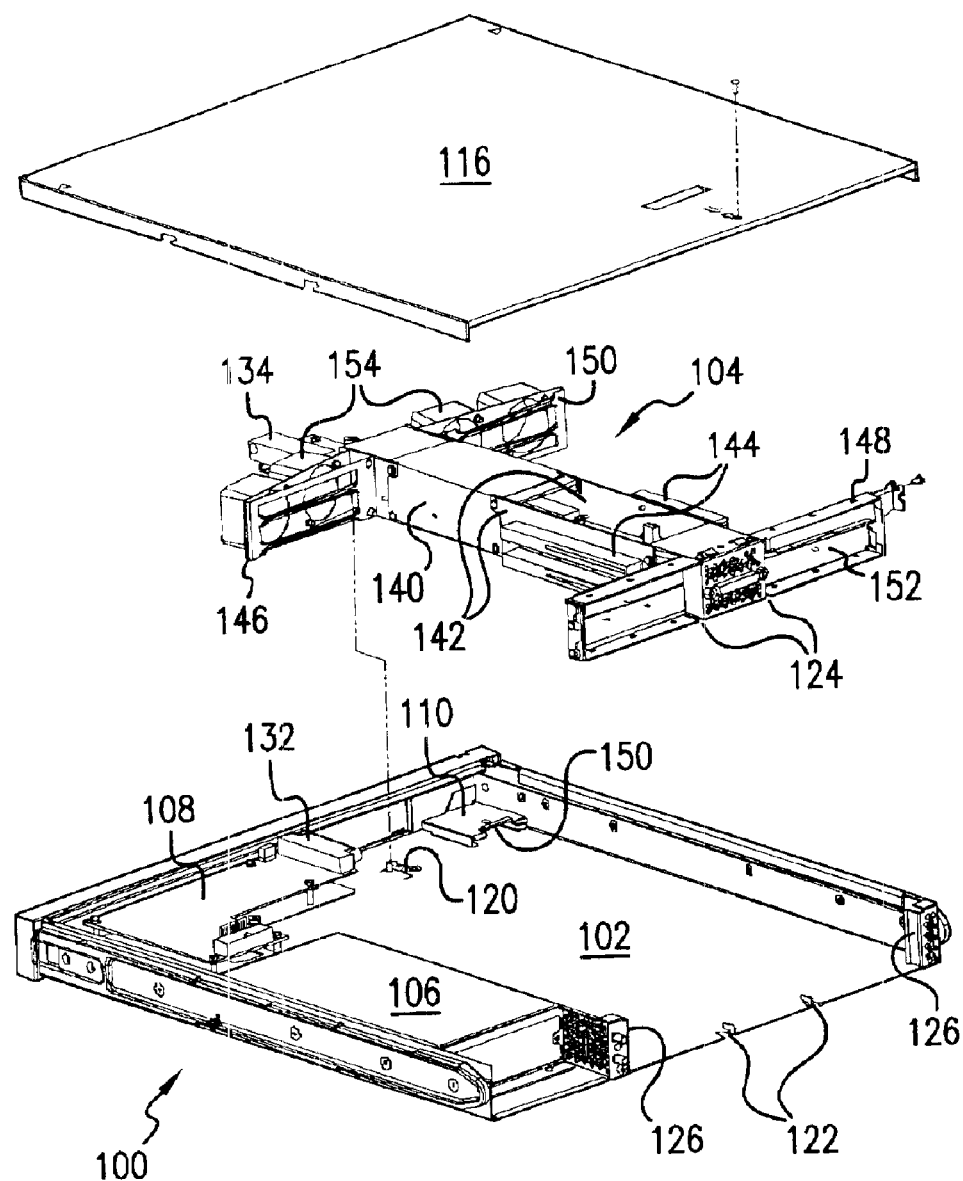
FIG. 1 is a rear perspective view of an expansion card enclosure, including a removable expansion card cage and a stabilizer, in accordance with an embodiment of the present invention.

The following description is presented to enable any person skilled in the art to make and use the invention, and is provided in the context of particular applications of the invention and their requirements. Various modifications to the disclosed embodiments will be readily apparent to those skilled in the art and the general principles defined herein may be applied to other embodiments and applications without departing from the scope of the present invention. Thus, the present invention is not intended to be limited to the embodiments shown, but is to be accorded the widest scope consistent with the principles and features disclosed herein.

The environment in which a present embodiment of the invention is implemented may incorporate a general-purpose or special-purpose computer. Details of such devices (e.g., processor, memory, data storage, display) may be omitted for the sake of clarity.

In one embodiment of the invention, an expansion card enclosure is provided for housing multiple expansion cards for augmenting the functionality of a computer system. The expansion card enclosure may be implemented as an integral portion of a computer system or may be implemented as a separate housing, for connection to a computer system. Multiple expansion card enclosures may be cascaded or may be simultaneously connected to one computer system to further increase the number of expansion cards with which a computer system may be augmented.

The expansion card enclosure includes a removable cage or assembly comprising one or more slots for connecting the expansion cards. In one implementation, the cage comprises four card slots. The expansion cards and slots may be configured according to virtually any type of interface, such as PCI (Peripheral Component Interconnect), SCSI (Small Computer System Interface), EISA (Extended Industry Standard Architecture), etc.

The removable cage not only provides connections for the expansion cards, but also adds rigidity to the enclosure and enables a small form factor. A portion of the cage may serve as a constituent portion of one or more walls of the enclosure and/or provide internal support. In one embodiment of the invention, the enclosure is just one standard rack unit tall (e.g., approximately 1¾ inches), thereby making it usable in a computer equipment rack while occupying minimal space.

The expansion card slots of the removable cage may be aligned horizontally, or substantially horizontally, to permit the one rack unit height. A rack-mountable version of the enclosure may be approximately nineteen inches wide, while the depth of the enclosure may depend upon a user's specifications (e.g., to match other equipment). One or more fans may be attached to the removable cage to help ensure proper air flow around the cards. LEDs (light emitting diodes) designed to indicate an enclosure status, signal a fault in a component of the enclosure, or provide other information may be placed on or in the front and/or rear walls of the enclosure.

The expansion card enclosure of one embodiment of the invention may also include a stabilizer for holding or engaging the removable cage while an expansion card is installed or removed. This eliminates the need for a user to attempt to hold the cage while simultaneously manipulating a card. Illustratively, the stabilizer may stabilize the expansion cage in an upright position, thereby allowing a card to be installed vertically. After the cage is configured with cards, it may be installed in the enclosure in a horizontal operating orientation.

FIG. 1 depicts an expansion card enclosure according to one embodiment of the invention. In this embodiment, enclosure 100 comprises base 102, removable expansion card cage 104, power supply 106, connection module 108, stabilizer 110 and cover 116. Card cage 104 comprises central member 140 with multiple riser cards 142, front cross-member 146 and rear cross-member 148. As shown in FIGS. 2–5, elements of enclosure 100 other than just expansion cage 104 may be removable or replaceable (e.g., power supply 106, connection module 108, stabilizer 110).

Base 102 of enclosure 100 may incorporate one or more prongs, tongues or other means to engage card cage 104 when the cage is installed. The cage may include corresponding slots, holes or grooves to receive the prongs. For example, in the embodiment of FIG. 1, prong 120 of enclosure base 102 engages a hole in the bottom of central member 140 of card cage 104, while prongs 122 engage slots 124 in rear cross-member 148. In this embodiment, the rear cross-member of the removable cage serves as a portion of the rear wall of enclosure 100. Captive screws may be used (e.g., with connection module 108, stabilizer 110, cage 104, etc.) to facilitate the releasable installation of various elements of the expansion enclosure.

After removable card cage 104 is installed, connection module 108 can be extended or slid into position to mate connector 132 with connector 134. In this embodiment of the invention, connection module 108 routes electrical power from power supply 106 to card cage 104. Connection module 108 and/or another element of enclosure 100 may provide data connectivity (e.g., for indicating an enclosure status to be signaled with a status indicator such as an LED). In one alternative embodiment of the invention, connection module 108 may be more permanently attached to removable card cage 104 or power supply 106.

Each riser card 142 of removable card cage 104 in FIG. 1 comprises one or more card slots 144, which may be aligned substantially horizontally. The illustrated embodiment features two slots on each riser card. For each card slot 144, front cross-member 146 of cage 104 comprises a corresponding card guide 150 (for receiving cards of suitable length). Rear cross-member 148 of the cage includes an aperture 152, for each slot 144, for accessing a data connector of a card when the expansion card enclosure is assembled and prepared for operation, and may also incorporate card guides. Front cross-member 146 may support one or more fans 154. In other embodiments, fans may be located elsewhere and may or may not be directly attached to the removable card cage.

When installed, removable card cage 104 engages prongs 120, 122 as described above, and flanges 126 of base 102 receive side edges of the rear of the cage. More particularly, the cage may be installed horizontally upon base 102, and then slid rearward to engage prongs 120, 122 and flanges 126. Thus, expansion card enclosure 100 is strengthened and made rigid, when the card cage is installed, by the position of removable cage 104 between base 102 and cover 116. The rear of the cage serves as part of the rear of the enclosure, and may include spring clips (not shown in FIG. 1) on the top and/or bottom of rear cross-member 148 to help reduce EMI (electromagnetic interference) and/or provide grounding when the enclosure is sealed.

Figure 2A:
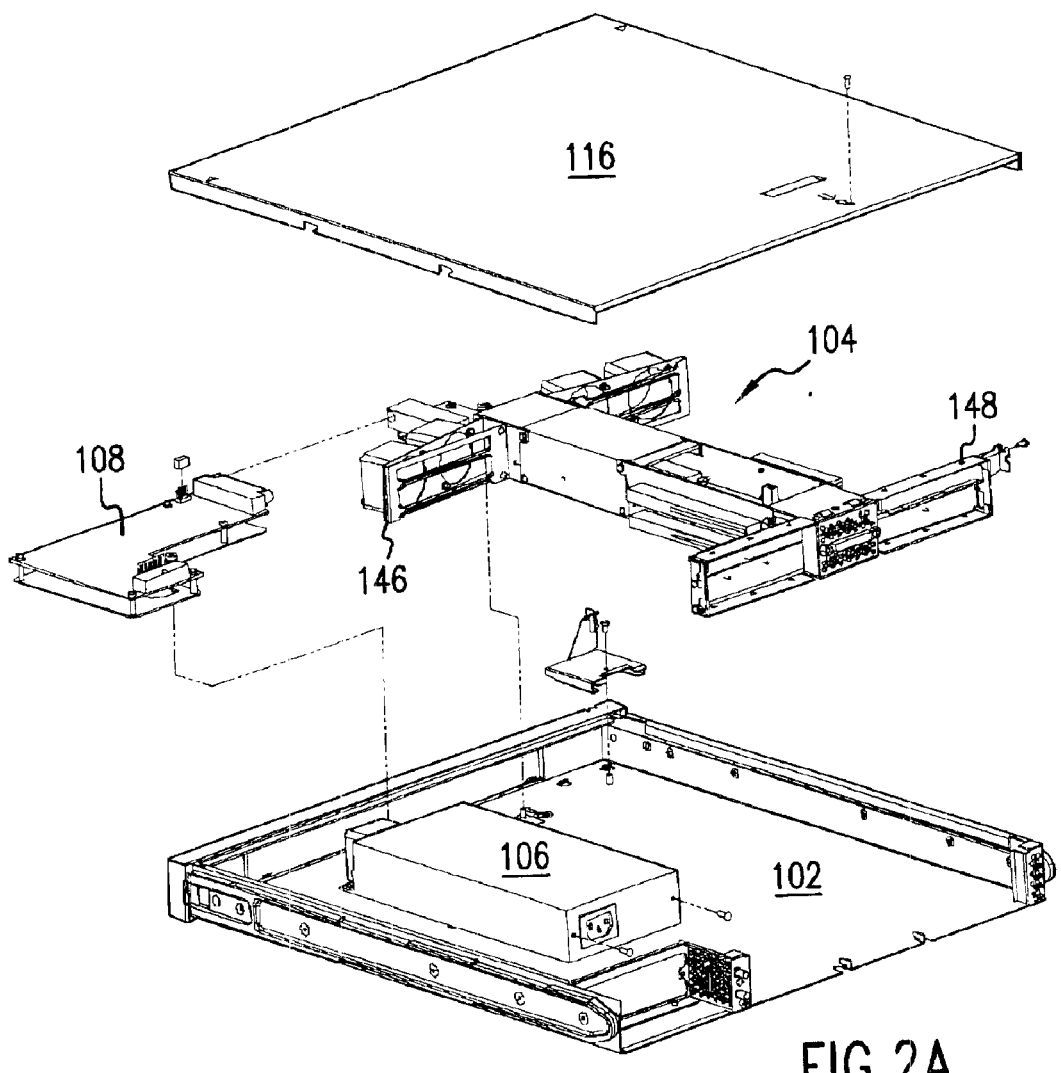
FIG. 2A is another view of the expansion card enclosure of FIG. 1, demonstrating the removable nature of one or more components, in accordance with an embodiment of the invention.
Figure 2B:
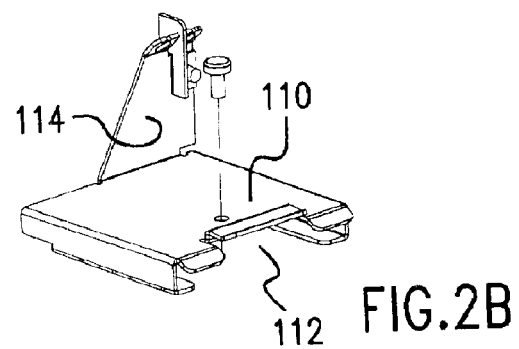
FIG. 2B is an expanded view of a stabilizer for facilitating the installation or removal of an expansion board in an embodiment of the invention.

FIG. 2A demonstrates the removable nature of card cage 104, power supply 106, connection module 108 and stabilizer 110. FIG. 2B provides an expanded view of stabilizer 110. In the embodiment of the invention depicted in FIG. 2B, stabilizer 110 includes mount 114 for supporting an enclosure status indicator-such as an LED or diode and associated circuitry. The mount may comprise a vertical support arising from the base portion of the stabilizer, or comprise a portion of such a vertical support. A status indicator may be affixed to the support.

Figure 3:
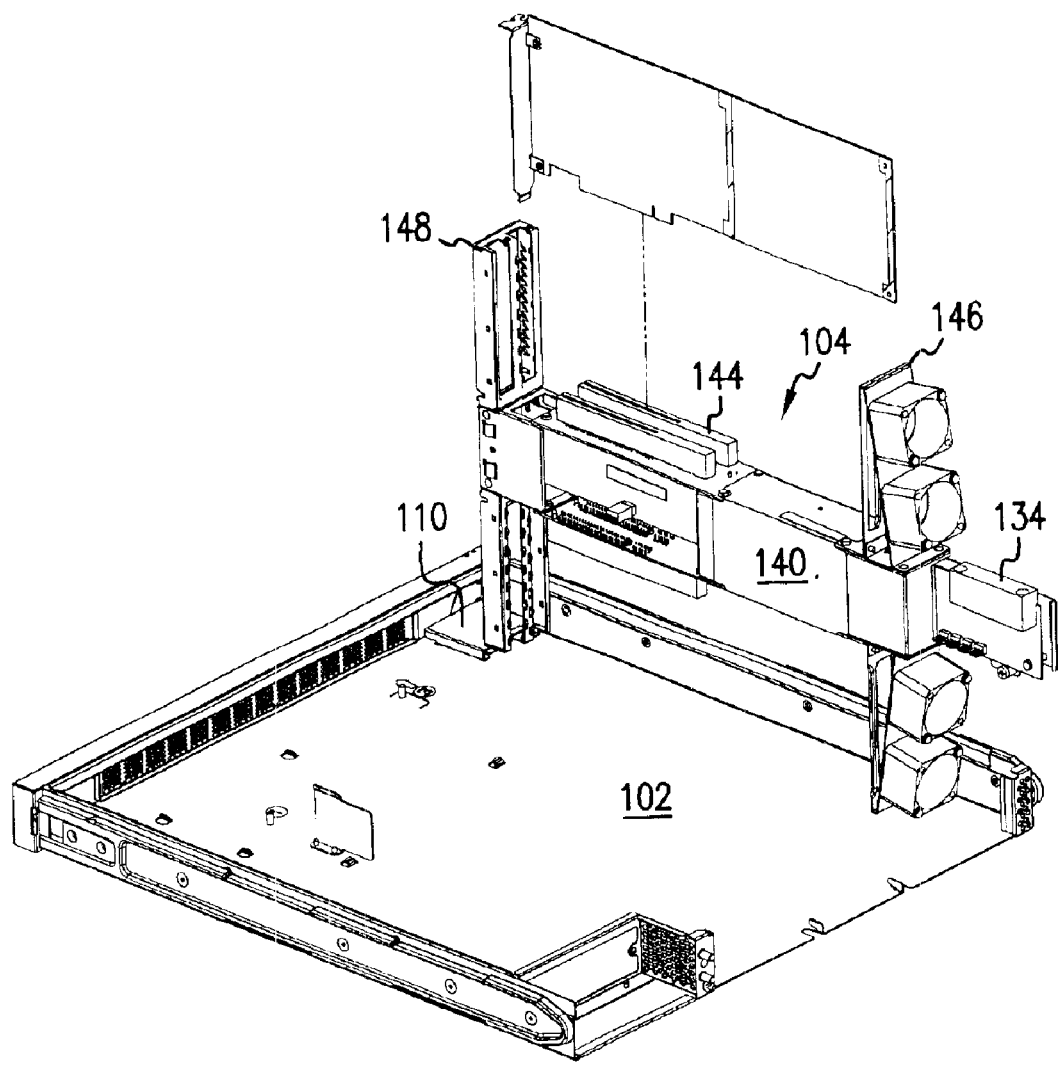
FIG. 3 depicts the expansion card enclosure of FIG. 1, in which a stabilizer is employed to stabilize the removable cage to facilitate the insertion or removal of an expansion card.

FIG. 3 demonstrates the use of stabilizer 110 of enclosure 100 to stabilize card cage 104 during the insertion or removal of an expansion card. As shown in FIG. 2B, the base or primary surface of stabilizer 110 includes lead-in tab or flange 112. A standoff may be installed beneath or as part of the base, and stabilizer 110 may be secured to base 102 of enclosure 100 using a captive screw or other permanent or semi-permanent means. A hook or prong on the underside of the stabilizer (not shown in FIG. 3) may be configured to engage base 102 of the expansion card enclosure.

In FIG. 3, card cage 104 is stabilized, in a vertical position, by inserting one side of rear cross-member 148 under lead-in tab 112, while front cross-member 146 rests on base 102. When the card cage is installed in an operational position (i.e., horizontal), the sides of rear cross-member 146 engage flanges 126, as described above. Tab 112, and/or the adjacent edge of the stabilizer, may be beveled or rounded to facilitate engagement of removable cage 104.

Figure 4:
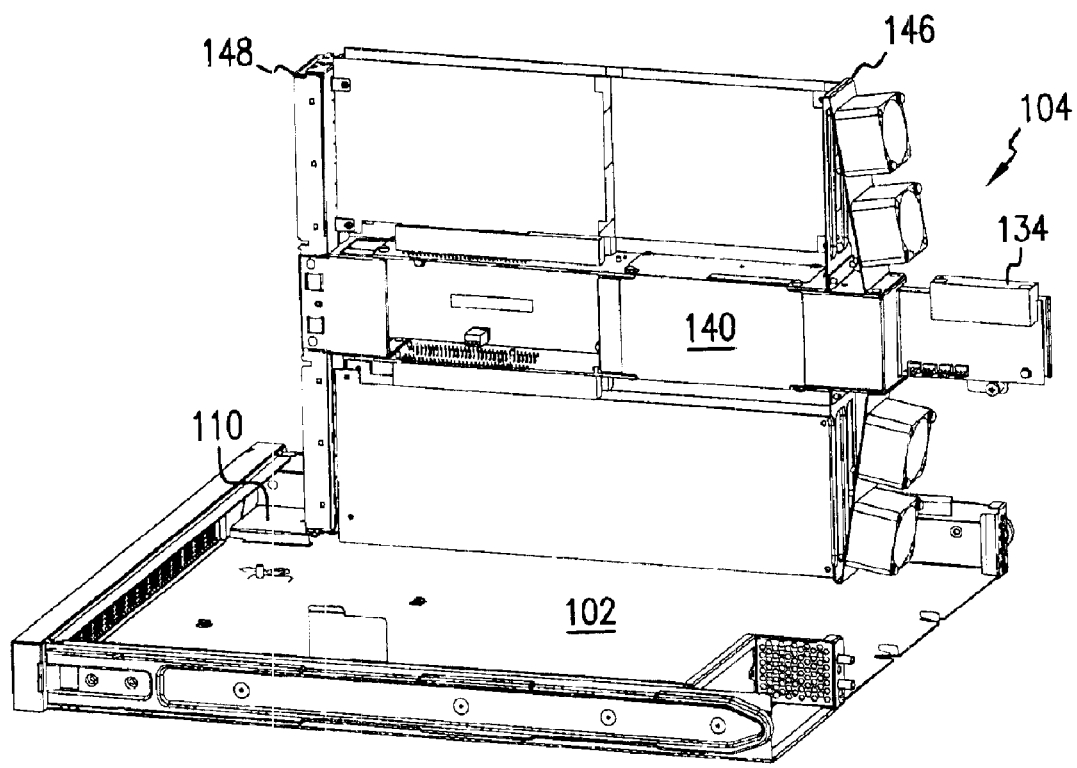
FIG. 4 is another view of the expansion card enclosure of FIG. 1, wherein a removable card cage is stabilized to facilitate manipulation of an expansion card.

Stabilizer 110 provides a stable platform for the cage during card manipulation, and limits movement of the cage upward or sideways, regardless of whether any expansion cards are connected to the cage. Thus, instead of trying to hold the cage with one hand while adding or removing a card with the other, a user may stabilize the cage with stabilizer 110 and use both hands to add or remove the card. This may reduce the likelihood of damaging a card or the cage (e.g., by bending one of the cross-supports) or misaligning a card. In other embodiments of the invention, stabilizer 110 may be located in a different area of the enclosure. FIG. 4 shows enclosure 100 with cage 104 populated with multiple expansion cards and stabilized upon stabilizer 110 for card manipulation.

Figure 5:
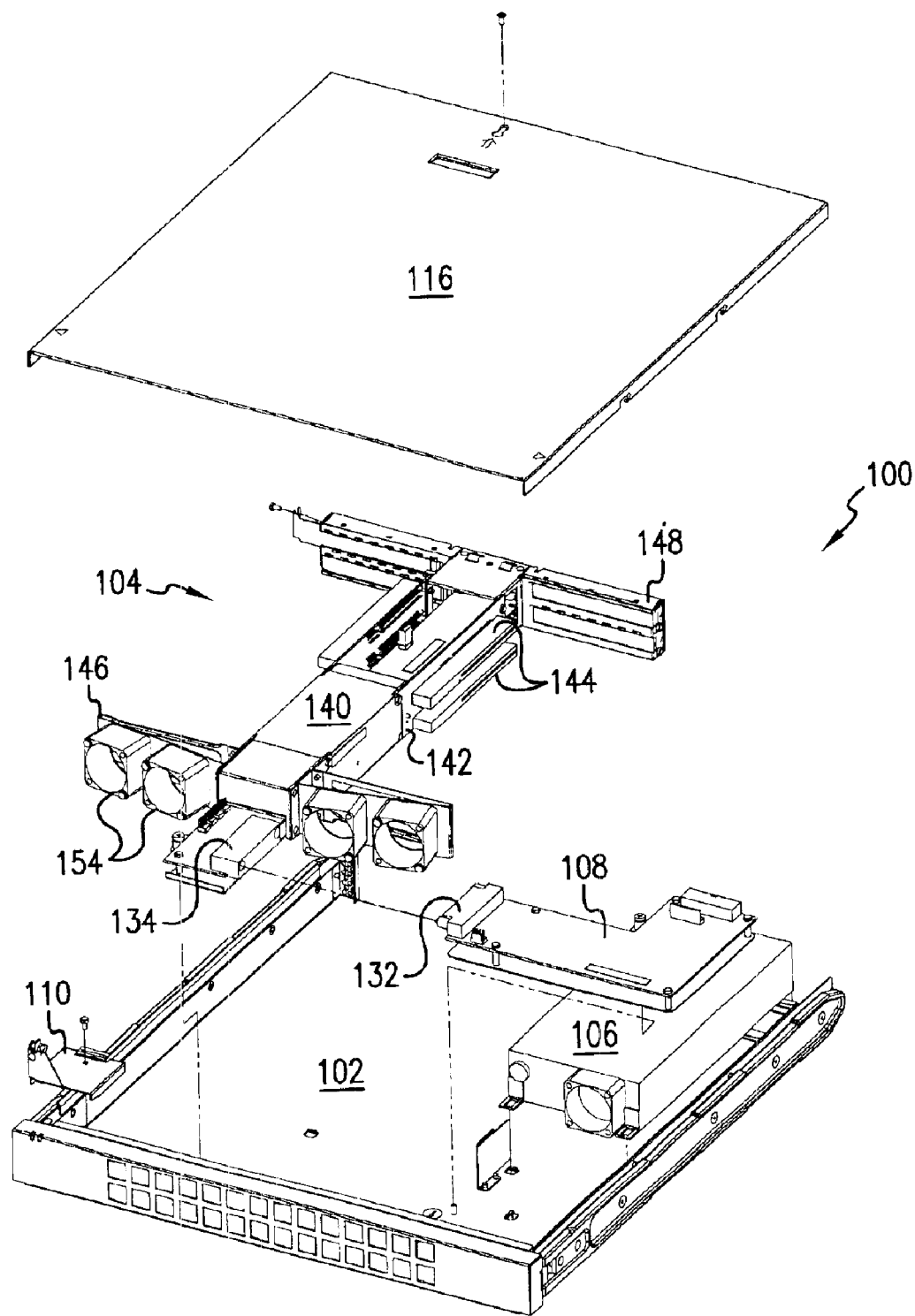
FIG. 5 is a front view of an expansion card enclosure comprising a removable card cage and a stabilizer, in accordance with an embodiment of the invention.

FIG. 5 provides a front view, of enclosure 100, including card cage 104, power supply 106, connection module 108 and stabilizer 110.

The foregoing descriptions of embodiments of the invention have been presented for purposes of illustration and description only. They are not intended to be exhaustive or to limit the invention to the forms depicted or disclosed. Accordingly, the above disclosure and accompanying figures are not intended to limit the invention; the scope of the invention is defined by the appended claims.

What is claimed is:

1. A stabilizer for stabilizing a card cage within an expansion card enclosure, to facilitate manipulation of a computer expansion card within the card cage, the stabilizer comprising:

a base configured for attachment to the expansion card enclosure; and a tab extending from said base for engaging the card cage, wherein said card cage is maintained in a first position for manipulating an expansion card in the card cage when engaged with said tab.

2. The stabilizer of claim 1, wherein said expansion card is operable with a computer system coupled to the expansion card enclosure when the card cage is attached to the expansion card enclosure in a second position.

3. The stabilizer of claim 1, further comprising a mount for a status indicator configured to indicate a status of the expansion card enclosure.

4. The stabilizer of claim 1, wherein said base is further configured for removable attachment to the expansion card enclosure.

5. The stabilizer of claim 1, wherein said tab extends from said base and defines a slot between said base and said tab.

6. The stabilizer of claim 1, wherein
said base comprises:
 a top; and
 a plurality of edges; and
said tab extends upward from said top of said base and an end of said tab is substantially parallel and vertically aligned with one of said edges.

7. The stabilizer of claim 6, wherein one or more of said tab and said one edge are beveled.

8. An enclosure for computer expansion cards, wherein the enclosure is electrically connectable to a computer system for operation of the expansion cards, said enclosure comprising:

a removable cage comprising connectors configured to receive the expansion cards; and a stabilizer for stabilizing said removable cage as an expansion card is manipulated in said removable cage;

wherein said stabilizer is uncoupled from said removable case during operation of the expansion cards.

9. The enclosure of claim 8, wherein the removable cage is stabilized by said stabilizer in a first position different from a second position in which said expansion card is operable within said removable cage.

10. The enclosure of claim 8, wherein said stabilizer comprises a mount for a status indicator configured to indicate a status of the enclosure.

11. The enclosure of claim 8, wherein said stabilizer comprises a tab extending from a first surface of the stabilizer;

wherein said tab is configured to facilitate stabilization of said removable cage between said tab and said first surface.

12. The enclosure of claim 11, wherein said stabilizer further comprises means for securing said stabilizer to the enclosure.

13. The enclosure of claim 11, wherein said securing means comprises a captive screw.

14. The enclosure of claim 8, wherein:
said stabilizer comprises:
 a base having a top and a plurality of edges; and
 a tab extending upward from said top of said base; and
an end of said tab is substantially parallel and vertically aligned with one of said edges.

15. An enclosure for housing multiple computer expansion cards, comprising:

an expansion card assembly comprising multiple expansion card slots for accepting computer expansion cards; and a stabilizer configured to stabilize said expansion card assembly while a first expansion card is manipulated in said assembly;

wherein the enclosure is no more than one rack unit in height.

16. The enclosure of claim 15, further comprising means for coupling said enclosure to an external computer system to enable operation of said computer expansion cards with the computer system.

17. The enclosure of claim 15, wherein said expansion card assembly is removable.

18. The enclosure of claim 17, wherein said expansion card assembly is maintained in a first orientation during operation of said computer expansion cards; and said expansion card assembly is stabilized by said stabilizer in a second orientation during said manipulation of said first expansion card.

19. The enclosure of claim 18, wherein said second orientation is substantially perpendicular to said first orientation.

20. The enclosure of claim 15, wherein said stabilizer comprises a status indicator configured to indicate a status of the enclosure.

* * * * *